(12) United States Patent
Lee et al.

(10) Patent No.: US 11,324,112 B2
(45) Date of Patent: May 3, 2022

(54) ANTENNA DEVICE AND ELECTRONIC DEVICE COMPRISING ANTENNA DEVICE

(71) Applicant: Samsung Electronics Co., Ltd., Gyeonggi-do (KR)

(72) Inventors: Junho Lee, Gyeonggi-do (KR); Antonio Ciccomancini Scogna, Gyeonggi-do (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 0 days.

(21) Appl. No.: 16/962,600

(22) PCT Filed: Jan. 25, 2019

(86) PCT No.: PCT/KR2019/001097
§ 371 (c)(1),
(2) Date: Jul. 16, 2020

(87) PCT Pub. No.: WO2019/147068
PCT Pub. Date: Aug. 1, 2019

(65) Prior Publication Data
US 2020/0413530 A1 Dec. 31, 2020

(30) Foreign Application Priority Data
Jan. 26, 2018 (KR) ........................ 10-2018-0009876

(51) Int. Cl.
*H01Q 1/52* (2006.01)
*H05K 1/02* (2006.01)
(Continued)

(52) U.S. Cl.
CPC ........... *H05K 1/0236* (2013.01); *H01Q 1/526* (2013.01); *H01Q 9/0407* (2013.01); *H01Q 21/06* (2013.01);
(Continued)

(58) Field of Classification Search
CPC .. H05K 1/0236; H05K 1/0243; H05K 9/0024; H05K 2201/10098; H01Q 1/42–1/52; H01Q 9/0407; H01Q 21/06
See application file for complete search history.

(56) References Cited

U.S. PATENT DOCUMENTS 6,337,661 B1 * 1/2002 Kondoh ................ H01L 23/552
257/E23.114
6,580,395 B2 * 6/2003 Koshizaka ............. H01P 1/211
343/700 MS
(Continued)

FOREIGN PATENT DOCUMENTS

KR 10-1007288 B1 1/2011
KR 10-2012-0044789 A 5/2015
(Continued)

OTHER PUBLICATIONS

Eakhwan Song & Hyun H. Park; "Shield can mounting clip design for robust and enhanced shielding effectiveness in mobile devices"; on IET Electronics Letters; Feb. 13, 2014; vol. 50, No. 4/ p. 318-320.
(Continued)

*Primary Examiner* — Hasan Islam
(74) *Attorney, Agent, or Firm* — Cha & Reiter, LLC.

(57) ABSTRACT

An antenna device comprises: a printed circuit board formed with both sides in a plate shape including a first surface and a second surface and including at least one conductive layer between the first surface and the second surface; an array of conductive plates formed parallel to the first surface on or in the printed circuit board; a wireless communication circuit electrically connected to the array of conductive plates, coupled to the first surface, and capable of transmitting or receiving frequencies between 3 GHz and 300 GHz; and a conductive shielding structure mounted on the first surface of the printed circuit board and electrically connected to the at least one conductive layer when covering the wireless communication circuit, wherein the conductive shielding structure may include: a third surface facing the first surface when seen from the top of the first surface; and an electromagnetic bandgap (EBG) structure formed on the third surface.

13 Claims, 12 Drawing Sheets

(51) Int. Cl.
*H01Q 9/04* (2006.01)
*H01Q 21/06* (2006.01)
*H05K 9/00* (2006.01)

(52) U.S. Cl.
CPC ......... *H05K 1/0243* (2013.01); *H05K 9/0024* (2013.01); *H05K 2201/10098* (2013.01)

(56) References Cited

U.S. PATENT DOCUMENTS

| | | |
|---|---|---|
| 2009/0051467 A1* | 2/2009 | McKinzie, III ....... H01P 1/2005 333/219 |
| 2011/0026234 A1 | 2/2011 | Kim et al. |
| 2012/0119969 A1* | 5/2012 | MacDonald ......... H05K 1/0236 343/841 |
| 2013/0099006 A1 | 4/2013 | Hong et al. |
| 2015/0029062 A1 | 1/2015 | Ng et al. |
| 2015/0303562 A1 | 10/2015 | Chen |
| 2015/0305210 A1 | 10/2015 | Yu et al. |
| 2017/0048991 A1 | 2/2017 | Kim et al. |

FOREIGN PATENT DOCUMENTS

| | | |
|---|---|---|
| KR | 10-1629105 B1 | 6/2016 |
| KR | 10-2017-0020138 A | 2/2017 |

OTHER PUBLICATIONS

Korean Search Report dated Jan. 25, 2022.

\* cited by examiner

ANTENNA DEVICE AND ELECTRONIC DEVICE COMPRISING ANTENNA DEVICE

CROSS REFERENCE TO RELATED APPLICATIONS

This application is a National Phase Entry of PCT International Application No. PCT/KR2019/001097, which was filed on Jan. 25, 2019, and claims a priority to Korean Patent Application No. 10-2018-0009876, which was filed on Jan. 26, 2018, the contents of which are incorporated herein by reference.

TECHNICAL FIELD

Various embodiments of the disclosure relate to an antenna device and an electronic device including the antenna device.

BACKGROUND ART

Electronic devices that can perform wireless communication are becoming increasingly popular. In order to satisfy the demands for wireless data traffic that is increasing since 4G communication systems have become widely used, next-generation communication systems are being developed, and for example, a 5G communication system and a WiGig communication system are being developed. Electronic devices can support various communication systems.

DISCLOSURE OF INVENTION

Technical Problem

The quality of the communication signal of electronic devices may be deteriorated by an Electromagnetic Interference (EMI) or a Radio Frequency Interference (RFI). In general, a shield can be used to reduce EMI and RFI of electronic devices.

mmWave communication is performed using a high-band frequency (e.g., 27.5~28.3 GHz), but when a shield can has a size that influences the resonance frequency of a mmWave band, some of signals in the mmWave band that should be radiated from an antenna are lost to the shield can, so the transmission power or the reception performance may decrease.

According to various embodiments of the disclosure, an electronic device may include a shield can having an Electromagnetic Band Gap (EBG) structure.

Solution to Problem

An electronic device according to various embodiments includes: a housing having a first plate and a second plate facing the opposite direction to the first plate; an antenna structure disposed in the housing and including a printed circuit board (PCB), which has a first surface facing the first plate, a second surface facing the second plate, and one or more conductive layers between the first surface and the second surface, and an array of conductive plates disposed on or in the printed circuit boar in parallel with the first surface; a radio frequency integrated chip mounted on the first surface, electrically connected with the array of conductive plates, and configured to transmit and/or receive a signal having a frequency between 3 GHz and 300 GHz; and a conductive shield structure covering the radio frequency integrated chip, mounted on the first surface of the printed circuit board, and electrically connected with the conductive layer, when seen from above the first surface, in which the conductive shield structure may have a third surface facing the first surface and an Electromagnetic Band Gap (EBG) structure disposed on the third surface.

An antenna device according to various embodiments includes: a printed circuit board formed in a plate shape with both sides of a first surface and a second surface, and having one or more conductive layers between the first surface and the second surface; an array of conductive plates disposed on or in the printed circuit board in parallel with the first surface; a radio frequency integrated chip electrically connected with the array of conductive plates, coupled to the first surface, and being able to transmit or receive a frequency between 3 GHz and 300 GHz; and a conductive shield structure mounted on the first surface of the printed circuit board and electrically connected with the one or more conductive layers when covering the radio frequency integrated chip, in which the conductive shield structure has: a third surface facing the first surface; and an Electromagnetic Band Gap (EBG) structure disposed on the third surface when seen from above the first surface.

Advantageous Effects of Invention

An antenna device according to various embodiments of the disclosure and an electronic device including the antenna device use a shield can having an Electromagnetic Band Gap (EBG) structure, thereby preventing some of signals in a mmWave band that should be radiated from an antenna from being lost to the shield can. Accordingly, it is possible to improve the antenna performance.

MODE FOR THE INVENTION

Figure 1:
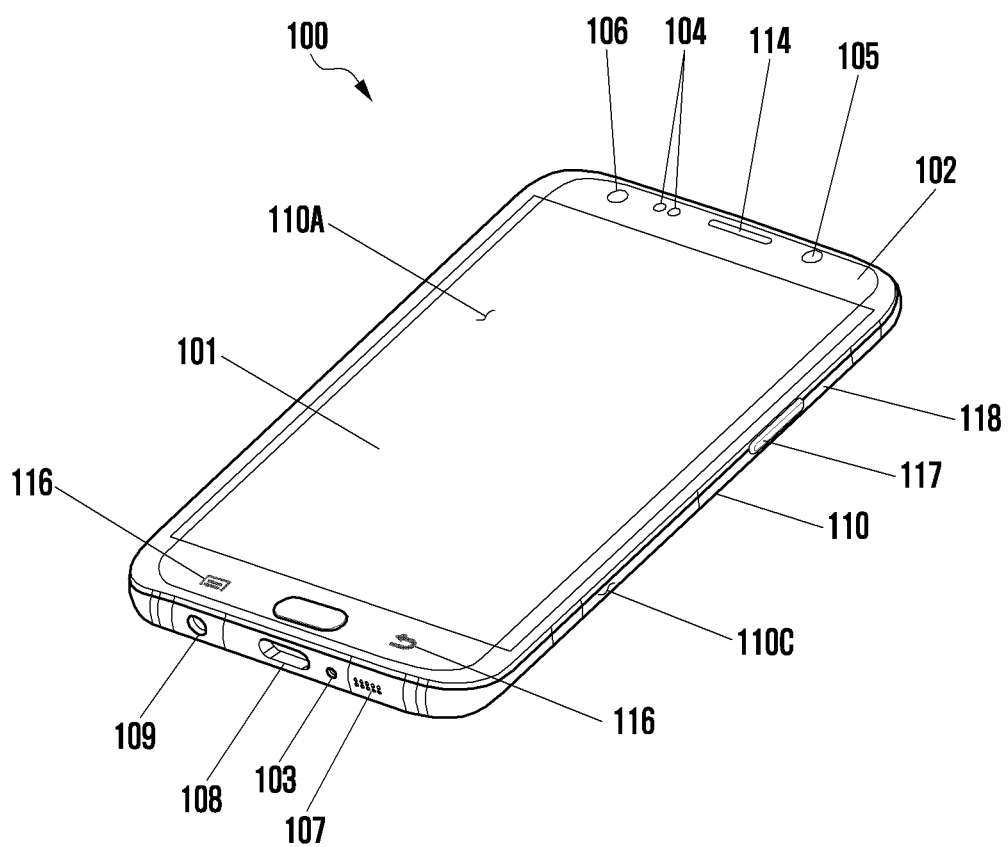
FIG. 1 is a front perspective view of a mobile electronic device according to an embodiment.
Figure 2:
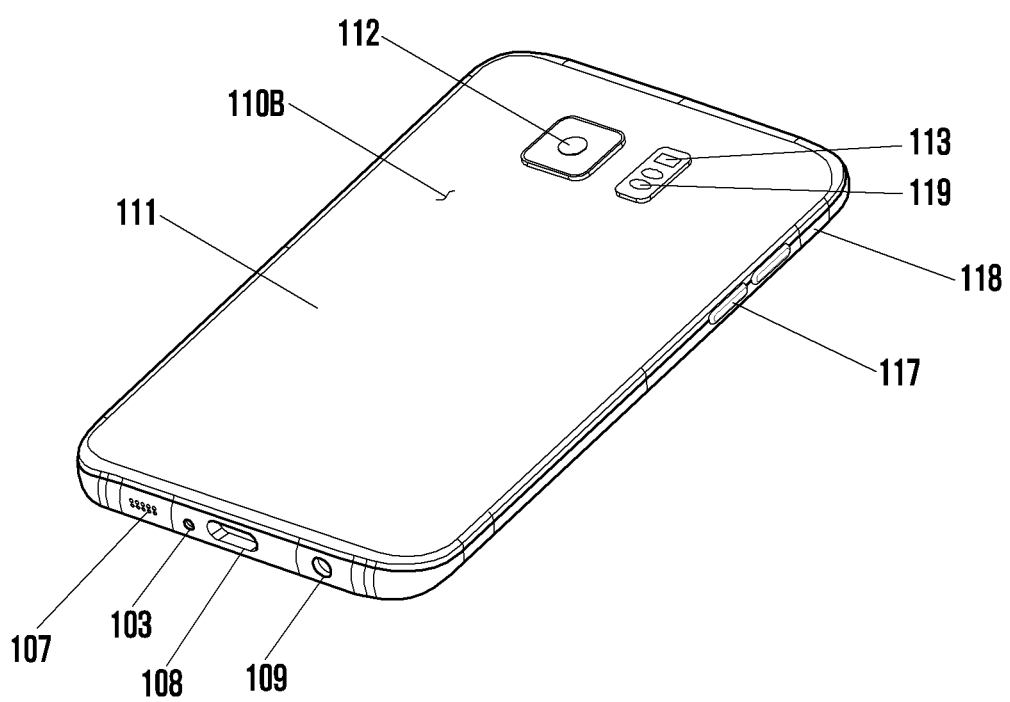
FIG. 2 is a rear perspective view of the electronic device of FIG. 1.
Figure 3:
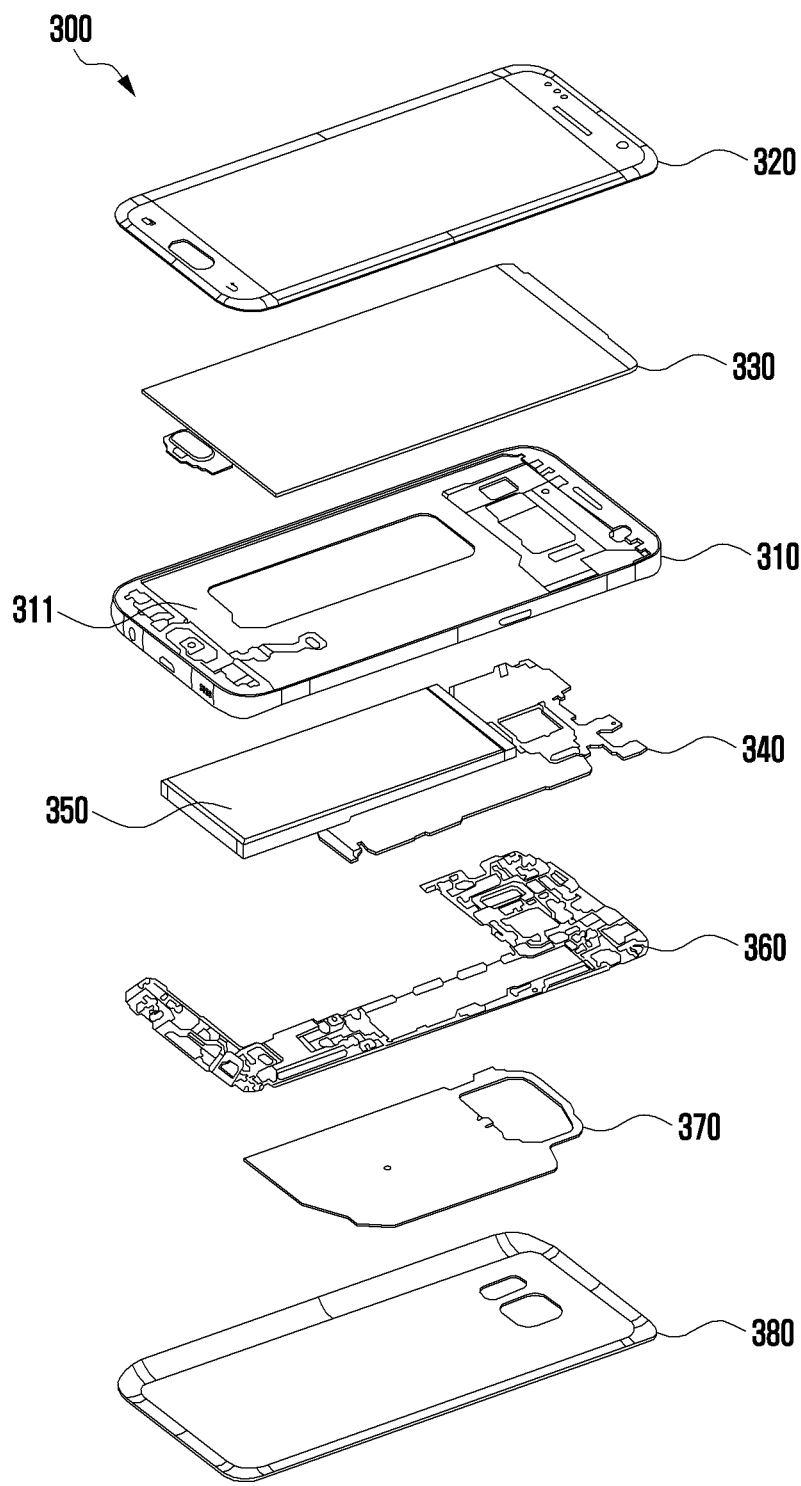
FIG. 3 is an exploded perspective view of the electronic device of FIG. 1.

FIG. 1 is a perspective view of the front surface of a mobile electronic device according to an embodiment. FIG. 2 is a perspective view of the rear surface of the electronic device of FIG. 1. FIG. 3 is a developed perspective view of the electronic device of FIG. 1.

Referring to FIG. 1 and FIG. 2, an electronic device 100 according to an embodiment may include a housing 110 including a first plate (or front surface) 110A, a second plate (or rear surface) 110B, and a side surface 110C surrounding the space between the first plate 110A and the second plate 110B. In another embodiment (not illustrated), the housing may denote a structure that forms a part of the first plate 110A, the second plate 110B, and the side surface 110C illustrated in FIG. 1. According to an embodiment, the first plate 110A may be formed by a front plate 102, at least a part of which is substantially transparent (for example, a glass plate including various coating layers, or a polymer plate). The second plate 110B may be formed by a rear plate 111 that is substantially opaque. The rear plate 111 may be made of coated or colored glass, ceramic, polymer, metal (for example, aluminum, stainless steel (STS), or magnesium), or a combination of at least two of the above-mentioned materials. The side surface 110C may be formed by a side bezel structure (or "side member") 118 which is coupled to the front plate 102 and to the rear plate 111, and which includes metal and/or polymer. In some embodiments, the rear plate 111 and the side bezel structure 118 may be formed integrally and may include the same material (for example, a metal material such as aluminum).

According to an embodiment, the electronic device 100 may include at least one of a display 101, audio modules 103, 107, and 114, sensor modules 104, and 119, camera modules 105, 112, and 113, a key input device 115, 116, 117, a indicator 106, and connector holes 108 and 109. In some embodiments, at least one of the constituent elements (for example, the key input device 115, 116, 117 or the indicator 106) of the electronic device 100 may be omitted, or the electronic device 100 may additionally include another constituent element.

The display 101 may be exposed through a corresponding part of the front plate 102, for example. The display 101 may be coupled to or arranged adjacent to a touch sensing circuit, a pressure sensor capable of measuring the intensity (pressure) of a touch, and/or a digitizer that detects a magnetic field-type stylus pen.

The audio modules 103, 107, and 114 may include a microphone hole 103 and speaker holes 107 and 114. A microphone for acquiring an external sound may be arranged in the microphone hole 103, and a plurality of microphones may be arranged therein such that the direction of a sound can be sensed in some embodiments. The speaker holes 107 and 114 may include an outer speaker hole 107 and a speech receiver hole 114. In some embodiments, the speaker holes 107 and 114 and the microphone hole 103 may be implemented as a single hole, or a speaker may be included (for example, a piezoelectric speaker) without the speaker holes 107 and 114.

The sensor modules 104, and 119 may generate an electric signal or a data value corresponding to the internal operating condition of the electronic device 100 or the external environment condition thereof. The sensor modules 104, and 119 may include, for example, a first sensor module 104 (for example, a proximity sensor) arranged on the first plate 110A of the housing 110, and/or a second sensor module (not illustrated) (for example, a fingerprint sensor), and/or a third sensor module 119 (for example, an HRM sensor) arranged on the second plate 110B of the housing 110. The fingerprint sensor may be arranged not only on the first plate 110A (for example, a home key button 115) of the housing 110, but also on the second plate 110B thereof. The electronic device 100 may further include a sensor module not illustrated, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or a luminance sensor 104.

The camera modules 105, 112, and 113 may include a first camera device 105 arranged on the first plate 110A of the electronic device 100, a second camera device 112 arranged on the second plate 110B thereof, and/or a flash 113. The camera devices 105 and 112 may include a single lens or a plurality of lenses, an image sensor, and/or an image signal processor. The flash 113 may include, for example, a light-emitting diode or a xenon lamp. In some embodiments, two or more lenses (an infrared camera, a wide-angle lens, and a telephoto lens) and image sensors may be arranged on a single surface of the electronic device 100.

The key input device 115, 116, 117 may include the home key button 115 be arranged on the first plate 110A of the housing 110, a touch pad 116 disposed around the home key button 115 and/or the side key button 117 be arranged on the side surface 110*c* of the housing 110. In another embodiment, the electronic device 100 may not include a part of the above-mentioned key input device 115, 116, 117 or the entire key input device 115, 116, 117, and the key input device 115, 116, 117 (not included) may be implemented in another type, such as a soft key, on the display 101.

The indicator 106 may be arranged on the first plate 110A of the housing 110, for example. The indicator 106 may provide information regarding the condition of the electronic device 100 in a light type, for example. The indicator 106 may include, for example, an LED.

The connector holes 108 and 109 may include a first connector hole 108 capable of containing a connector (for example, a USB connector) for transmitting/receiving power and/or data to/from an external electronic device, and/or a second connector hole (for example, an earphone jack) 109 capable of containing a connector for transmitting/receiving an audio signal to/from the external electronic device.

Referring to FIG. 3, the electronic device 300 may include a side bezel structure 310, a first support member 311 (for example, a bracket), a front plate 320, a display 330, a printed circuit board 340, a battery 350, a second support member 360 (for example, a rear case), an antenna 370, and a rear plate 380. In some embodiments, at least one of the constituent elements (for example, the first support member 311 or the second support member 360) of the electronic device 300 may be omitted, or the electronic device 300 may further include another constituent element. At least one of the constituent elements of the electronic device 300 may be identical or similar to at least one of the constituent elements of the electronic device 100 of FIG. 1 or FIG. 2, and repeated descriptions thereof will be omitted herein.

The first support member 311 may be arranged inside the electronic device 300 and connected to the side bezel structure 310, or may be formed integrally with the side bezel structure 310. The first support member 311 may be made of a metal material and/or a nonmetal (for example, polymer) material, for example. The display 330 may be coupled to one surface of the first support member 311, and the printed circuit board 340 may be coupled to the other surface thereof. A processor, a memory, and/or an interface may be mounted on the printed circuit board 340. The processor may include, for example, one or more of a central processing device, an application processor, a graphic processing device, an image signal processor, an sensor hub processor, or a communication processor.

The memory may include a volatile memory or a nonvolatile memory, for example.

The interface may include, for example, a high definition multimedia interface (HDMI), a universal serial bus (USB) interface, an SD card interface, and/or an audio interface. The interface may connect the electronic device 300 with an external electronic device electrically or physically, for example, and may include a USB connector, an SD card/MMC connector, or an audio connector.

The battery 350 is an device for supplying power to at least one constituent element of the electronic device 300, and may include a non-rechargeable primary cell, a rechargeable secondary cell, or a fuel cell, for example. At least a part of the battery 350 may be arranged on substantially the same plane with the printed circuit board 340, for example. The battery 350 may be arranged integrally inside the electronic device 300, or may be arranged such that the same can be attached to/detached from the electronic device 300.

The antenna 370 may be arranged between the rear plate 380 and the battery 350. The antenna 370 may include, for example, a near field communication (NFC) antenna, a wireless charging antenna, and/or a magnetic secure transmission (MST) antenna. The antenna 370 may conduct near-field communication with an external device or may wirelessly transmit/receive power necessary for charging, for example. In another embodiment, an antenna structure may be formed by a part or a combination of the side bezel structure 310 and/or the first support member 311.

Figure 4:
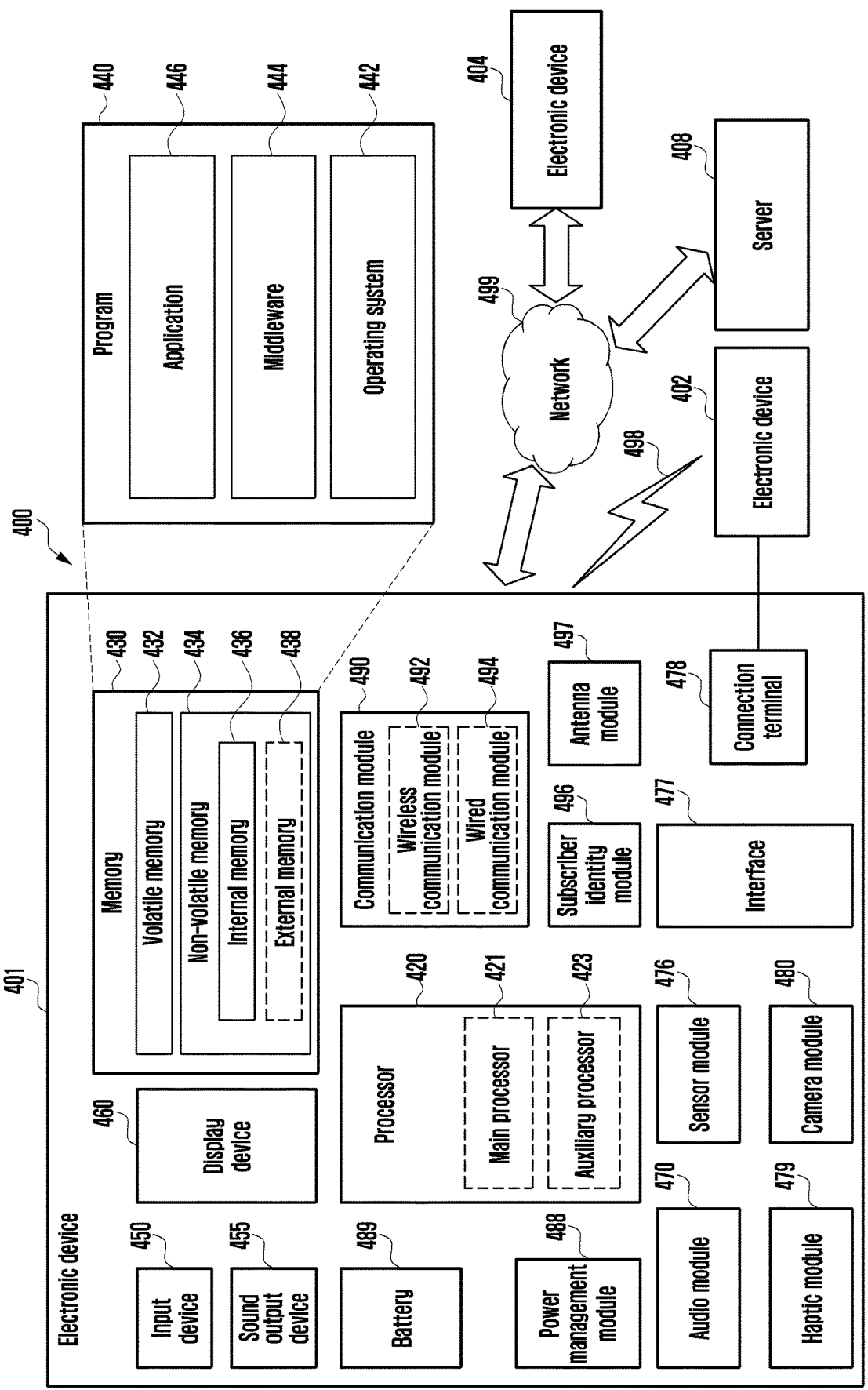
FIG. 4 is a block diagram of an electronic device in a network environment according to various embodiments.

FIG. 4 is a block diagram illustrating an electronic device 401 in a network environment 400 according to various embodiments. Referring to FIG. 4, the electronic device 401 in the network environment 400 may communicate with an electronic device 402 via a first network 498 (e.g., a short-range wireless communication network), or an electronic device 404 or a server 408 via a second network 499 (e.g., a long-range wireless communication network). According to an embodiment, the electronic device 401 may communicate with the electronic device 404 via the server 408. According to an embodiment, the electronic device 401 may include a processor 420, memory 430, an input device 450, a sound output device 455, a display device 460, an audio module 470, a sensor module 476, an interface 477, a haptic module 479, a camera module 480, a power management module 488, a battery 489, a communication module 490, a subscriber identification module (SIM) 496, or an antenna module 497. In some embodiments, at least one (e.g., the display device 460 or the camera module 480) of the components may be omitted from the electronic device 401, or one or more other components may be added in the electronic device 401. In some embodiments, some of the components may be implemented as single integrated circuitry. For example, the sensor module 476 (e.g., a fingerprint sensor, an iris sensor, or an illuminance sensor) may be implemented as embedded in the display device 460 (e.g., a display).

The processor 420 may execute, for example, software (e.g., a program 440) to control at least one other component (e.g., a hardware or software component) of the electronic device 401 coupled with the processor 420, and may perform various data processing or computation. According to one embodiment, as at least part of the data processing or computation, the processor 420 may load a command or data received from another component (e.g., the sensor module 476 or the communication module 490) in volatile memory 432, process the command or the data stored in the volatile memory 432, and store resulting data in non-volatile memory 434. According to an embodiment, the processor 420 may include a main processor 421 (e.g., a central processing unit (CPU) or an application processor (AP)), and an auxiliary processor 423 (e.g., a graphics processing unit (GPU), an image signal processor (ISP), a sensor hub processor, or a communication processor (CP)) that is operable independently from, or in conjunction with, the main processor 421. Additionally or alternatively, the auxiliary processor 423 may be adapted to consume less power than the main processor 421, or to be specific to a specified function. The auxiliary processor 423 may be implemented as separate from, or as part of the main processor 421.

The auxiliary processor 423 may control at least some of functions or states related to at least one component (e.g., the display device 460, the sensor module 476, or the communication module 490) among the components of the electronic device 401, instead of the main processor 421 while the main processor 421 is in an inactive (e.g., sleep) state, or together with the main processor 421 while the main processor 421 is in an active state (e.g., executing an application). According to an embodiment, the auxiliary processor 423 (e.g., an image signal processor or a communication processor) may be implemented as part of another component (e.g., the camera module 480 or the communication module 490) functionally related to the auxiliary processor 423.

The memory 430 may store various data used by at least one component (e.g., the processor 420 or the sensor module 476) of the electronic device 401. The various data may include, for example, software (e.g., the program 440) and input data or output data for a command related thereto. The memory 430 may include the volatile memory 432 or the non-volatile memory 434.

The program 440 may be stored in the memory 430 as software, and may include, for example, an operating system (OS) 442, middleware 444, or an application 446.

The input device 450 may receive a command or data to be used by other component (e.g., the processor 420) of the electronic device 401, from the outside (e.g., a user) of the electronic device 401. The input device 450 may include, for example, a microphone, a mouse, or a keyboard.

The sound output device 455 may output sound signals to the outside of the electronic device 401. The sound output device 455 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 460 may visually provide information to the outside (e.g., a user) of the electronic device 401. The display device 460 may include, for example, a display, a hologram device, or a projector and control circuitry to control a corresponding one of the display, hologram device, and projector. According to an embodiment, the display device 460 may include touch circuitry adapted to detect a touch, or sensor circuitry (e.g., a pressure sensor) adapted to measure the intensity of force incurred by the touch.

The audio module 470 may convert a sound into an electrical signal and vice versa. According to an embodiment, the audio module 470 may obtain the sound via the input device 450, or output the sound via the sound output device 455 or a headphone of an external electronic device (e.g., an electronic device 402) directly (e.g., wiredly) or wirelessly coupled with the electronic device 401.

The sensor module 476 may detect an operational state (e.g., power or temperature) of the electronic device 401 or an environmental state (e.g., a state of a user) external to the electronic device 401, and then generate an electrical signal or data value corresponding to the detected state. According to an embodiment, the sensor module 476 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 477 may support one or more specified protocols to be used for the electronic device 401 to be coupled with the external electronic device (e.g., the electronic device 402) directly (e.g., wiredly) or wirelessly. According to an embodiment, the interface 477 may include, for example, a high definition multimedia interface (HDMI), a universal serial bus (USB) interface, a secure digital (SD) card interface, or an audio interface.

A connecting terminal 478 may include a connector via which the electronic device 401 may be physically connected with the external electronic device (e.g., the electronic device 402). According to an embodiment, the connecting terminal 478 may include, for example, a HDMI connector, a USB connector, a SD card connector, or an audio connector (e.g., a headphone connector).

The haptic module 479 may convert an electrical signal into a mechanical stimulus (e.g., a vibration or a movement) or electrical stimulus which may be recognized by a user via his tactile sensation or kinesthetic sensation. According to an embodiment, the haptic module 479 may include, for example, a motor, a piezoelectric element, or an electric stimulator.

The camera module 480 may capture a still image or moving images. According to an embodiment, the camera module 480 may include one or more lenses, image sensors, image signal processors, or flashes.

The power management module 488 may manage power supplied to the electronic device 401. According to one embodiment, the power management module 488 may be implemented as at least part of, for example, a power management integrated circuit (PMIC).

The battery 489 may supply power to at least one component of the electronic device 401. According to an embodiment, the battery 489 may include, for example, a primary cell which is not rechargeable, a secondary cell which is rechargeable, or a fuel cell.

The communication module 490 may support establishing a direct (e.g., wired) communication channel or a wireless communication channel between the electronic device 401 and the external electronic device (e.g., the electronic device 402, the electronic device 404, or the server 408) and performing communication via the established communication channel. The communication module 490 may include one or more communication processors that are operable independently from the processor 420 (e.g., the application processor (AP)) and supports a direct (e.g., wired) communication or a wireless communication. According to an embodiment, the communication module 490 may include a wireless communication module 492 (e.g., a cellular communication module, a short-range wireless communication module, or a global navigation satellite system (GNSS) communication module) or a wired communication module 494 (e.g., a local area network (LAN) communication module or a power line communication (PLC) module). A corresponding one of these communication modules may communicate with the external electronic device via the first network 498 (e.g., a short-range communication network, such as Bluetooth™, wireless-fidelity (Wi-Fi) direct, or infrared data association (IrDA)) or the second network 499 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 492 may identify and authenticate the electronic device 401 in a communication network, such as the first network 498 or the second network 499, using subscriber information (e.g., international mobile subscriber identity (IMSI)) stored in the subscriber identification module 496.

The antenna module 497 may transmit or receive a signal or power to or from the outside (e.g., the external electronic device) of the electronic device 401. According to an embodiment, the antenna module 497 may include a plurality of antennas. In such a case, at least one antenna appropriate for a communication scheme used in the communication network, such as the first network 498 or the second network 499, may be selected, for example, by the communication module 490 (e.g., the wireless communication module 492) from the plurality of antennas. The signal or the power may then be transmitted or received between the communication module 490 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

At least one of the components of the electronic device 400 may be the same as or similar to at least one of the components of the electronic device 100 of FIG. 1 or FIG. 2, and duplicate description will be omitted below.

According to an embodiment, commands or data may be transmitted or received between the electronic device 401 and the external electronic device 404 via the server 408 coupled with the second network 499. Each of the electronic devices 402 and 404 may be a device of a same type as, or a different type, from the electronic device 401. According to an embodiment, all or some of operations to be executed at the electronic device 401 may be executed at one or more of the external electronic devices 402, 404, or 408. For example, if the electronic device 401 should perform a function or a service automatically, or in response to a request from a user or another device, the electronic device 401, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 401. The electronic device 401 may provide the outcome, with or without further processing of the outcome, as at least part of a reply to the request. To that end, a cloud computing, distributed computing, or client-server computing technology may be used, for example.

Figure 5:
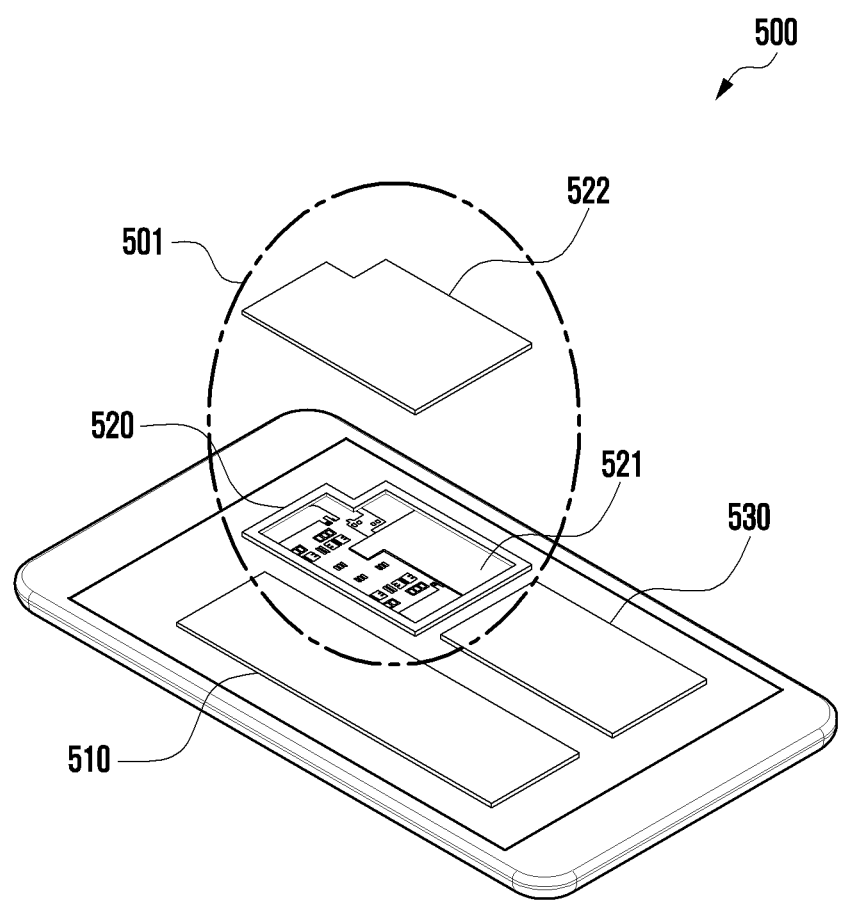
FIG. 5 is an exploded plan view of the electronic device of FIG. 1.

FIG. 5 is an exploded plan view of the electronic device of FIG. 1. FIG. 5 is a plan view showing an electronic device 500 with a portion of a second surface 110b of a housing 110 of the electronic device 500 removed.

The electronic device 500 may include a battery 510 and a first printed circuit board 520 or a second printed circuit board 530. A processor, a memory, and/or an interface may be mounted on the first printed circuit board 520 or the second printed circuit board 530.

One or more Radial Frequency Integrated Chips (RFIC) 521 may be mounted on the first printed circuit board 520.

According to an embodiment, the first printed circuit board 520 is formed in a plate shape and may have a first surface or a second surface. For example, the RFIC 521 may be mounted on the first surface and wires may be disposed on the second surface so that the part mounted on the first printed circuit board 520 can be electrically connected.

According to an embodiment, one or more conductive layers may be disposed between the first surface and the second surface. One or more dielectric layers may be disposed between the first surface and the second surface. For example, the one or more dielectric layers may be formed by a substrate. In the first printed circuit board 520, one or more conductive layers and one or more dielectric layers are alternately stacked between the first surface and the second surface, thereby being able to electrically separate the one or more conductive layers. An array of conductive layers may be disposed on or in the first printed circuit board 520 in parallel with the first surface.

According to an embodiment, the RFIC 521 may be electrically connected to the array of conductive layers. The RFIC 521 may be configured to transmit and/or receive a signal having a frequency between 3 GHz and 100 GHz.

According to an embodiment, when a shield can 522 is coupled to the first surface, at least a portion of the shield can 522 may be electrically connected with the one or more conductive layers.

According to an embodiment, a processor, a memory, and/or an interface may be mounted on the second printed circuit board 530. The second printed circuit board 530 may have one or more conductive layers. The second printed circuit board 530 may have one or more dielectric layers.

According to an embodiment, the first printed circuit board 520 and the second printed circuit board 530 may be electrically connected to each other. In various embodiments, the first printed circuit board 520 and the second printed circuit board 530 may be formed as one substrate.

According to an embodiment, the shield can 522 may be combined with the first printed circuit board 520 on which one or more RFICs 521 are mounted.

In various embodiments, when the first printed circuit board 520 and the second printed circuit board 530 are formed as one substrate, a portion to which the shield can 522 is coupled at the portion where an array of conductive plates or the one or more RFICs 521 are mounted may be referred to an antenna device 501.

According to an embodiment, the shield can 522, which is a conductive shield structure, may have an Electromagnetic Band Gap (EBG) structure. The shield can 522 can prevent electromagnetic interference between elements and can prevent electromagnetic interference or radio frequency interference exiting or entering the area covered with the shield can 522.

According to an embodiment, the shield can 522 can cover the RFIC 521 or at least a portion of the first printed circuit board 520. A space may be defined between the shield can 522 and the portion covered with the shield can 522 of the first surface of the first printed circuit board 520. When the space is defined, an EBG structure may be disposed on a third surface facing the first surface of the first printed circuit board 520 by the shield can 522.

According to an embodiment, an EBG structure may be a structure that forms a stop band blocking an electromagnetic wave in a specific frequency band by forming a small conductive patch having a fine and periodic pattern on a dielectric.

According to an embodiment, in order that the shield can 522 has an EBG structure, a conductive patch and a dielectric may also be formed on the third surface when the shield can 522 is formed by 3D printing.

In various embodiments, in order that the shield 522 has an EBG structure, a conductive patch is formed on the third surface when the shield can 522 is formed by casting, and then a dielectric is attached, whereby an EBG structure may be formed in the shield can 522.

In various embodiments, in order that the shield can 522 has an EBG structure, an EBG structure may be formed in the shield can 522 by bonding a conductive film and a conductive patch. The conductive film, for example, may be an anisotropic conductive film.

At least one of the components of the electronic device 500 may be the same as or similar to the components of at least one of the electronic device 100 shown in FIG. 1 or FIG. 2, the electronic device 300 shown in FIG. 3, and the electronic device 500 shown in FIG. 4, and repeated description is omitted below.

Figure 6A:
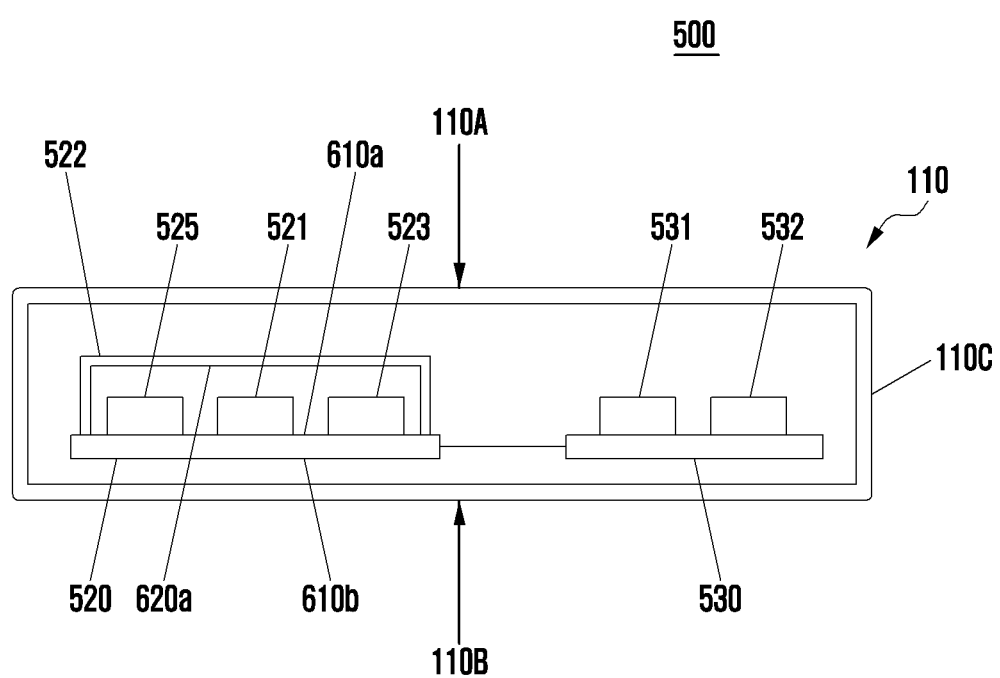
FIG. 6A is a cross-sectional view of the electronic device of FIG. 1.

FIG. 6A is a cross-sectional view of the electronic device 500 of FIG. 1.

Figure 6B:
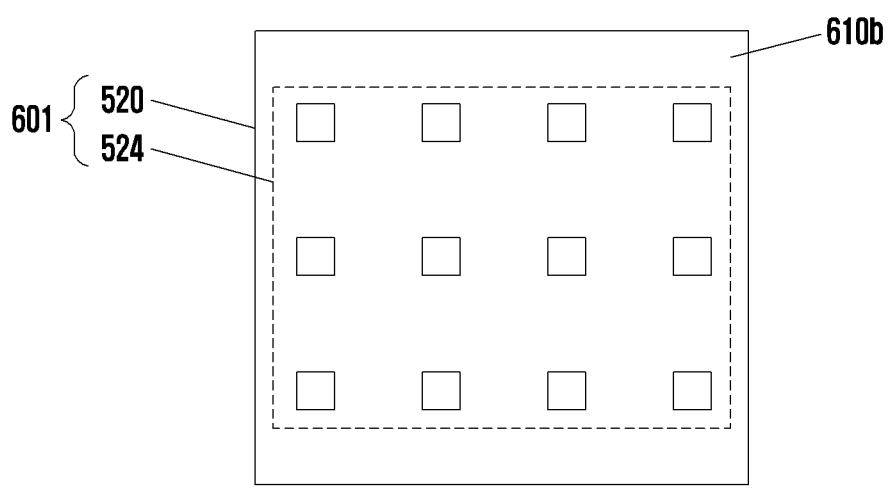
FIG. 6B is a front view of a first printed circuit board according to various embodiments of the disclosure seen in the direction of a second surface.

FIG. 6B is a front view of the first printed circuit board 520 according to various embodiments of the disclosure seen in the direction of a second surface 610*b*.

One or more RFICs 521, 522, and 523 may be mounted on the first printed circuit board 520.

The first printed circuit board 520 is formed in a plate shape and may have a first surface 610*a* or a second surface 610*b*. For example, a first RFIC 521, a second RFIC 523 or a third RFIC 525 may be mounted on the first surface 610*a*.

Referring to FIG. 6B, an array 524 of conductive plates may be disposed on the second surface 610*b* of the first printed circuit board 520 or in the first printed circuit board 520. For example, the array 524 of conductive plates may be an antenna array. An antenna included in the array 524 of conductive plates, for example, may be a patch antenna. The array 524 of conductive plates can give directionality to output power.

The array 524 of conductive plates may be disposed on or in the first printed circuit board 520 in parallel with the first surface 610*a*. For example, the array 524 of conductive plates may be disposed on or in the second surface 610*b*.

According to an embodiment, an antenna structure 601 may include a first printed circuit board 520 and an array 524 of conductive plates disposed on the first printed circuit board 520. For example, the antenna structure 601 may include: a printed circuit board (PCB) 520 having a first surface 610*a* facing a first plate 110A, a second surface 610*b* facing a second plate 110*b*, and one or more conductive layers disposed between the first surface 610*a* and the second surface 610*b*; and an array 524 of conductive plates disposed on or in the printed circuit board 520 in parallel with the first surface 610*a*.

The first surface 610*a* may face the front 110A of the electronic device 500 and the second surface 610*b* may face the rear 110B of the electronic device 500. The electronic device 500 according to an embodiment may include a housing 110 having a first plate (or a front) 110A, a second surface (or a rear) 110B, and a side 110C surrounding the space between the first surface 110A and the second surface 110B. According to an embodiment, one or more conductive layers may be disposed between the first surface 610*a* and the second surface 610*b*. One or more dielectric layers may be disposed between the first surface 610a and the second surface 610b. An antenna array 524 may be disposed on at least some of the one or more conductive layers. For example, the one or more dielectric layer may be formed by a substrate. In the first printed circuit board 520, one or more conductive layers and one or more dielectric layers are alternately stacked between the first surface 610a and the second surface 610b, thereby being able to electrically separate the one or more conductive layers.

According to an embodiment, the RFICs 521, 522, and 523 may be electrically connected to the array 524 of conductive layers. For example, the first RFICs 521, 522, and 523 may be configured to transmit and/or receive a signal having a frequency between 3 GHz and 300 GHz.

According to an embodiment, when at least a portion of a shield can 522 is coupled to the first surface 610a, at least a portion of the shield can 522 may be electrically connected with the one or more conductive layers.

According to an embodiment, when at least a portion of a conductive shield structure (e.g., the shield can 522) is coupled to the first surface 610a, at least a portion of the shield can 522 may be electrically connected with the one or more conductive layers 502.

According to an embodiment, the conductive shield structure (e.g., the shield can 522) can cover at least a portion of the first surface 610a of the first printed circuit board 520, and a space may be defined between the conductive shield structure (e.g., the shield can 522) and the portion covered with the shield structure (e.g., the shield can 522) of the first surface of the first printed circuit board 520. When the space is defined, an EBG structure may be disposed on a third surface 620a facing the first surface 610a of the first printed circuit board 520 by the conductive shield structure (e.g., the shield can 522).

According to an embodiment, the shield can 522 can cover at least a portion of the first surface 610a of the first printed circuit board 520, and a space may be defined between the shield can 522 and the portion covered with the shield can 522 of the first surface of the first printed circuit board 520. When the space is defined, an EBG structure may be disposed on a third surface 620a facing the first surface 610a of the first printed circuit board 520 by the shield can 522.

According to an embodiment, a processor 531 and/or a memory 532 may be mounted on the second printed circuit board 530. The second printed circuit board 530 may have one or more conductive layers. The second printed circuit board 530 may have one or more dielectric layers.

According to an embodiment, the first printed circuit board 520 and the second printed circuit board 530 may be electrically connected to each other. In various embodiments, the first printed circuit board 520 and the second printed circuit board 530 may be formed as one substrate.

Figure 7:
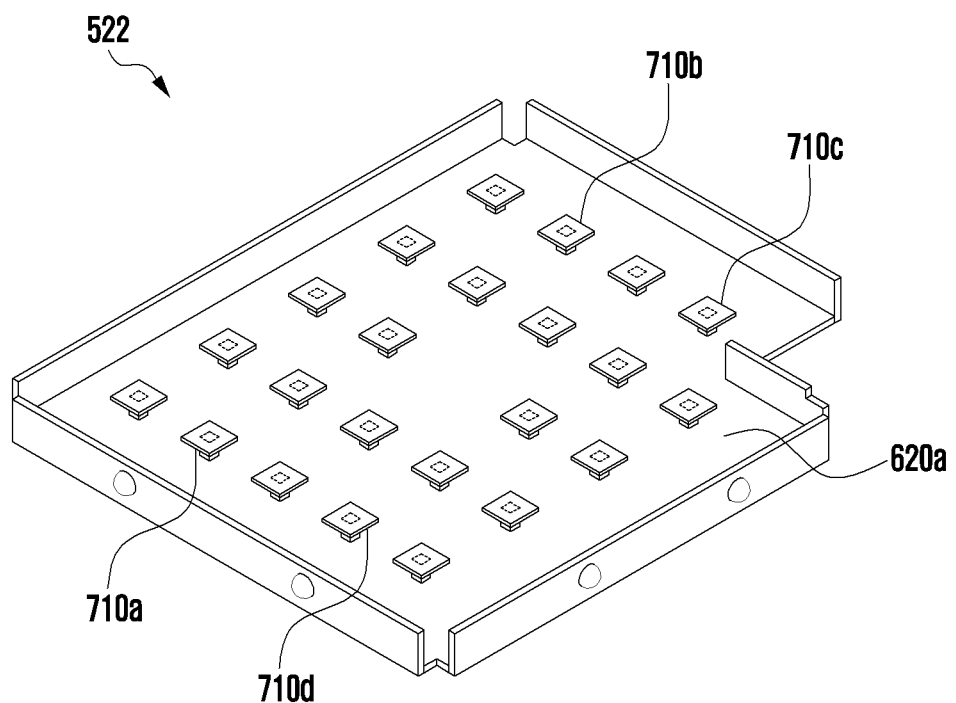
FIG. 7 is a perspective view showing a shield can according to various embodiments of the disclosure.

FIG. 7 is a perspective view showing the shield can 522 according to various embodiments of the disclosure.

According to an embodiment, the shield can 522 may be manufactured in a can, housing, or enclosure shape by bending a portion a plate-shaped frame using a metal plate or plastic added with conductive metal (e.g., Fe, Cu, and Ni). The shield can 522 may be manufactured in a lid shape by bending a portion of a plate-shaped frame.

According to an embodiment, an EBG structure may be disposed on a third surface 620a facing the first surface 610a of the first printed circuit board 520 when the shield can 522 is mounted on the first printed circuit board 520.

According to an embodiment, the EBG structure may be a structure that forms a stop band blocking an electromagnetic wave in a specific frequency band by forming a plurality of conductive patches 710a, 710b, 710c, and 710d having a periodic pattern. In FIG. 7, components shown in similar shapes may be the same or similar components.

According to an embodiment, the conductive patches 710a, 710b, 710c, and 710d may be periodically disposed on the third surface 620a with regular intervals therebetween. The conductive patches 710a, 710b, 710c, and 710d may be electrically connected to the third surface 620a through respective conductive vias. The conductive patches 710a, 710b, 710c, and 710d and the third surface 620a are electrically connected through the conductive vias, and an insulating layer may be disposed between the conductive patches 710a, 710b, 710c, and 710d and the third surface 620a. The insulating layer may be disposed on the third surface 620a and the conductive vias may be formed through the insulating layer.

According to an embodiment, the shapes and sizes of the conductive patches 710a, 710b, 710c, and 710d may be designed in various ways. For example, the conductive patches 710a, 710b, 710c, and 710d may be formed in various shapes and sizes such as a rectangle, a circle, a crosshair type, a swastika type, or a hexagonal type.

According to an embodiment, the conductive vias coupled to the conductive patches 710a, 710b, 710c, and 710d may form a stop band, and in this case, a resonance frequency may be inferred as follows.

For example, one conductive patch and one conductive via coupled to the conductive patch may be one EBG structure. In an EBG structure having a rectangular patch according to an embodiment of the disclosure, the capacitance C of the EGB structure may be expressed as in Equation 1, the inductance L thereof may be expressed as in Equation 2, and the resonance frequency $f_0$ thereof may be expressed as in Equation 3.

$$C = \frac{W\varepsilon_0(1+\varepsilon_r)}{\pi}\cosh^{-1}\left(\frac{W+g}{g}\right) \quad \text{[Equation 1]}$$

$$L = 2*10^{-7}h\left[\ln\left(\frac{2h}{r}\right)+0.5\left(\frac{2r}{h}\right)-0.75\right] \quad \text{[Equation 2]}$$

$$f_0 = \frac{1}{2\pi\sqrt{LC}} \quad \text{[Equation 3]}$$

where W is the side length of the patch, g is the gap between EBG structures or the gap between the patches, h is the length of the conductive via or the thickness of the dielectric, r is the radius of the conductive via, $\varepsilon_0$ is the permittivity of a free space, and $\varepsilon_r$ is relative permittivity.

It is possible to change the resonance frequency of the EBG structure by changing the side length of the patch, the gap between EBG structures or the gap between the patches, the length of the conductive via or the thickness of the dielectric, the radius of the conductive via, etc. in the designing step.

Figure 8:
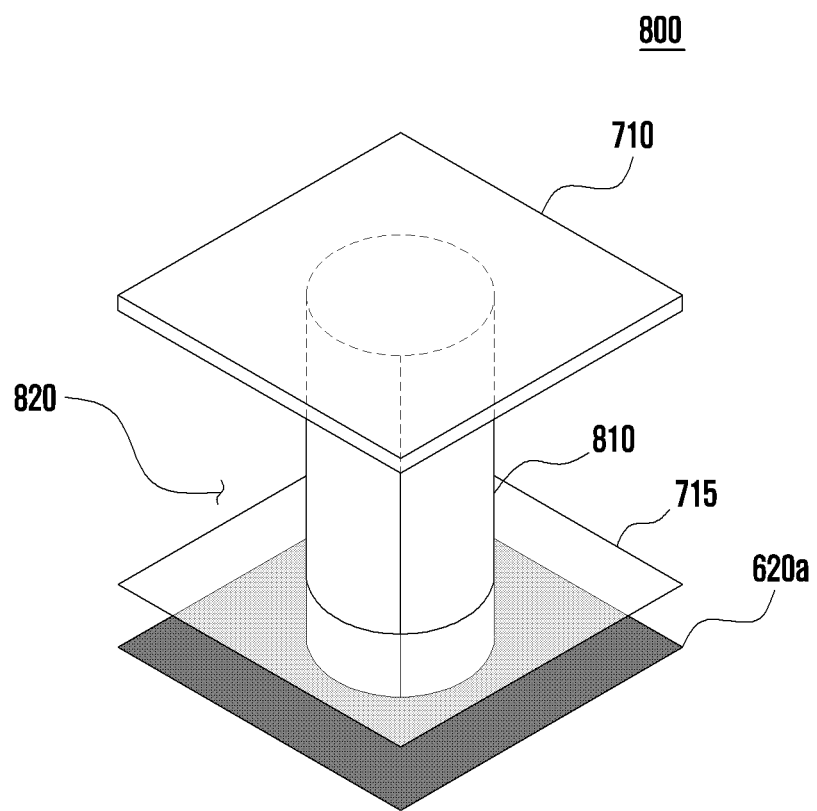
FIG. 8 is a perspective view showing a unit Electromagnetic Band Gap (EBG) structure according to various embodiments of the disclosure.

FIG. 8 is a perspective view showing a unit Electromagnetic Band Gap (EBG) according to various embodiments of the disclosure.

According to an embodiment, in an Electromagnetic Band Gap (EBG) structure 800, a conductive patch 710 may be electrically coupled to the third surface 620a of the shield can 522 through a conductive via 810, and an insulator may be disposed between the conductive patch 710 and the third surface 620a spaced apart from each other by the conductive via 810. The conductive via 810, for example, may have a cylindrical or polyprism shape.

Figure 9:
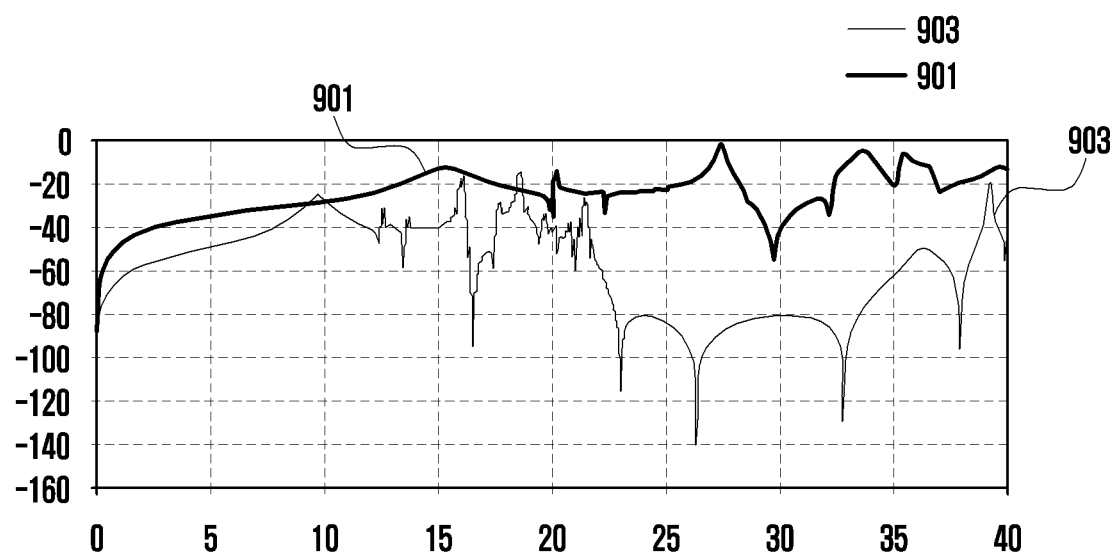
FIGS. 9 to 11 are graphs comparing noise-traveling characteristics in each frequency band of the shield can according to various embodiments of the disclosure and a shield can according to the related art.
Figure 10:
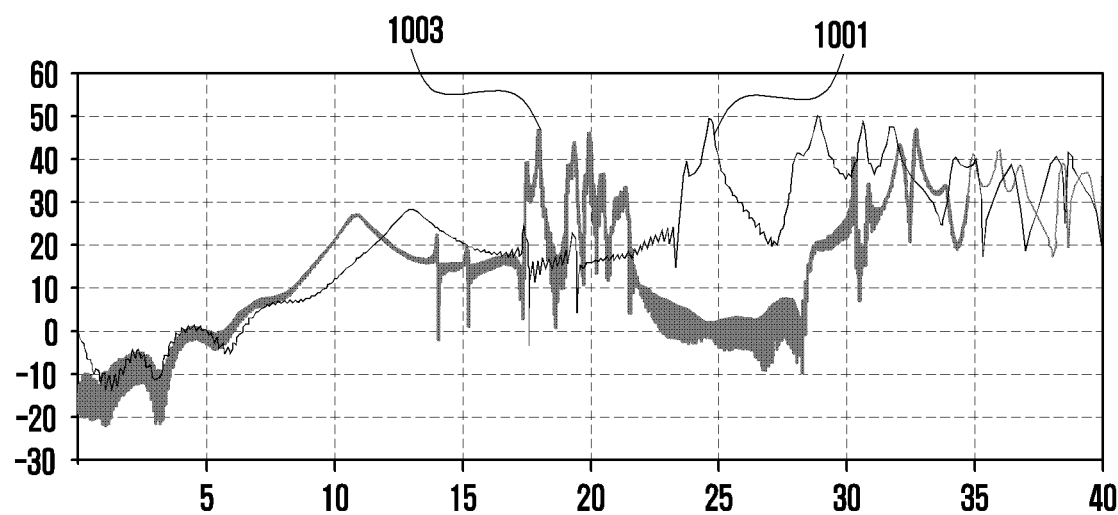
Figure 11:
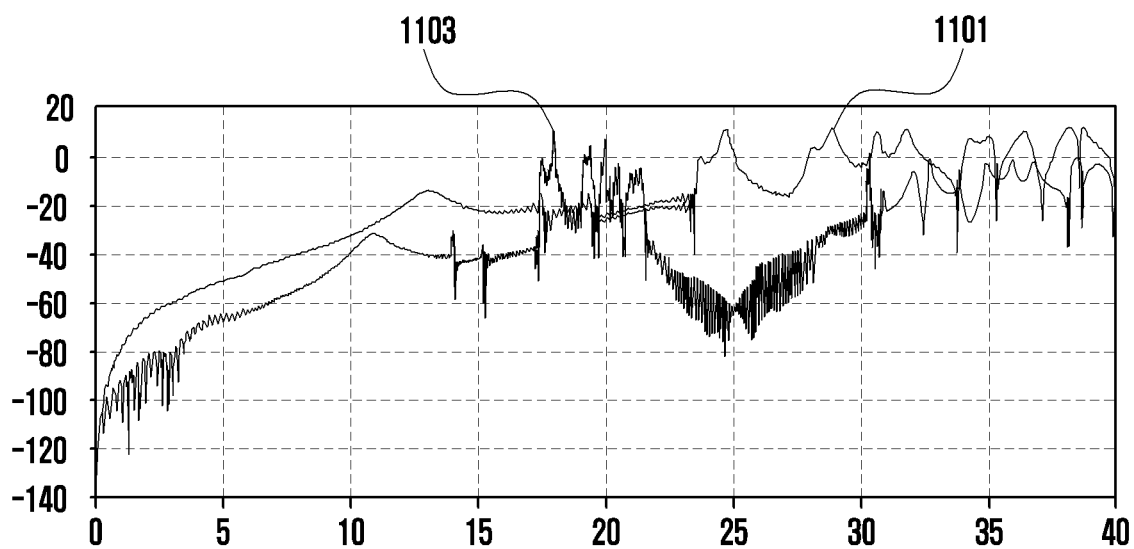

FIGS. 9 to 11 are graphs comparing noise-traveling characteristics in each frequency band of the shield can according to various embodiments of the disclosure and a shield can according to the related art.

FIG. 9 is a graph comparing noise-traveling characteristics in each frequency band in the shield can according to various embodiments of the disclosure and a shield can according to the related art, in which an s-parameter measured on the surfaces of the shield cans is shown. In the graph of FIG. 9, a signal was transmitted to and measured at a side of the shield cans from the center portion of a surface of the shield cans, in which the x-axis is a frequency band and the y-axis is dB.

Reference numeral '901' indicates a graph showing the noise-traveling characteristic in each frequency band of the shield can according to the related art and reference numeral '903' indicates a graph showing the noise-traveling characteristic in each frequency band of the shield can 522 having an EBG structure according to various embodiments of the disclosure.

The noise-traveling characteristic of the shield can 522 having an EBG structure according to various embodiments of the disclosure is lower in the entire band than the noise-traveling characteristic in each frequency band of the shield can according to the related art, and for example, it can be seen that the combination noise remarkably decreases in the band from 20 GHz to 30 GHz.

FIG. 10 is a graph for comparing shielding effectiveness in each frequency band of the shield can according to various embodiment of the disclosure and the shield can according to the related art, which shows an example of measuring and comparing electric fields transmitted from the insides of the shield cans to the outside of the shield cans (e.g., 0.5 cm upward from the surfaces of the shield cans). In the graph of FIG. 10, a signal was transmitted to and measured at a side of the shield cans from the center portion over a surface of the shield cans, in which the x-axis is a frequency band and the y-axis is dB.

Reference numeral '1001' indicates a graph showing an electric field transmitted from the inside of the shield can according to the related art to the outside of the shield can in each frequency band and reference numeral '1003' indicates a graph showing the magnitude of an electric field measured outside the shield can 522 having an EBG according to various embodiments of the disclosure in each frequency band of the shield can.

The shield characteristic of the shield can 522 having an EBG structure according to various embodiments of the disclosure increases in the entire band than the shield characteristic in each frequency band of the shield can according to the related art, and for example, it can be seen that the shield characteristic remarkably increases in the band from 20 GHz to 30 GHz.

FIG. 11 is a graph for comparing shielding effectiveness in each frequency band of the shield can according to various embodiments of the disclosure and the shield can according to the related art, which shows an example of measuring and comparing electric fields transmitted from the insides of the shield cans to the outside of the shield cans (e.g., 03 cm upward from the surfaces of the shield cans). In the graph of FIG. 11, a signal was transmitted to and measured at a side of the shield cans from the center portion over a surface of the shield cans, in which the x-axis is a frequency band and the y-axis is dB.

Reference numeral '1101' indicates a graph showing the magnitude of an electric field measured outside the shield can according to the related art in each frequency band and reference numeral '1103' indicates a graph showing the magnitude of an electric field measured outside the shield can 522 having an EBG according to various embodiments of the disclosure in each frequency band of the shield can.

The shield characteristic of the shield can 522 having an EBG structure according to various embodiments of the disclosure increases in the entire band than the shield characteristic in each frequency band of the shield can according to the related art, and for example, it can be seen that the shield characteristic remarkably increases in the band from 20 GHz to 30 GHz.

An electronic device 500 according to various embodiments includes: a housing 110 having a first plate 110A and a second plate 110B facing the opposite direction to the first plate 110A; an antenna structure 601 disposed in the housing 110 and including a printed circuit board (PCB) 520, which has a first surface 610a facing the first plate, a second surface 610b facing the second plate 110B, and one or more conductive layers between the first surface 610a and the second surface 610b, and an array 524 of conductive plates disposed on or in the printed circuit boar 520 in parallel with the first surface 610a; a radio frequency integrated chip 521 mounted on the first surface 610a, electrically connected with the array 524 of conductive plates, and configured to transmit and/or receive a signal having a frequency between 3 GHz and 300 GHz; and a conductive shield structure 522 covering the radio frequency integrated chip 521, mounted on the first surface 610a of the printed circuit board 520, and electrically connected with the conductive layer, when seen from above the first surface 610a, in which the conductive shield structure 522 may have a third surface 620a facing the first surface 610a and an Electromagnetic Band Gap (EBG) structure 800 disposed on the third surface 620a.

The EBG structure 800 of the electronic device 500 according to various embodiments may include: a periodic pattern of conductive patches 710 facing the first surface 610a and spaced apart from the third surface 620a; and a plurality of conductive vias 810 electrically connected between each of the conductive patches 710 and the third surface 620a.

The conductive shield structure 522 of the electronic device 500 according to various embodiments may further include an insulating layer disposed on the third surface 620a between the conductive patches 710 and the third surface 620a, and the vias 810 may be formed through the insulating layer.

The electronic device 500 according to various embodiments may further include a display 101 exposed through at least a portion of the first plate 110A.

The conductive patches 710 and the conductive vias 810 of the electronic device 500 according to various embodiments each may be disposed on the third surface 620a by attaching a conductive film 715 of FIG. 8 to the third surface 620a

The conductive shield structure 522 of the electronic device 500 according to various embodiments may be manufactured in at least one of can, housing, enclosure, and lid shapes by bending a portion a plate-shaped frame using a metal plate or plastic added with conductive metal.

The conductive patches 710 of the electronic device 500 according to various embodiments may correspond to at least one of a rectangle, a circle, a crosshair type, a swastika type, and a hexagonal type.

The resonance frequency of the EBG structure 800 of the electronic device 500 according to various embodiments may be determined by the side lengths of the conductive patches 710, the gap between the conductive patches 710, the length of the conductive vias 810, and the radius of the conductive vias 810.

The conductive vias 810 of the electronic device 500 according to various embodiments may be cylinders or polyprisms.

An antenna device 501 according to various embodiments includes: a printed circuit board 520 formed in a plate shape with both sides of a first surface 610*a* and a second surface 610*b*, and having one or more conductive layers between the first surface 610*a* and the second surface 610*b*; an array 524 of conductive plates disposed on or in the printed circuit board 520 in parallel with the first surface 610*a*; a radio frequency integrated chip 521 electrically connected with the array 524 of conductive plates, coupled to the first surface 610*a*, and being able to transmit or receive a frequency between 3 GHz and 300 GHz; and a conductive shield structure 522 mounted on the first surface 610*a* of the printed circuit board 520 and electrically connected with the conductive layers when covering the radio frequency integrated chip 521, in which the conductive shield structure has a third surface 620*a* facing the first surface 610*a* and an Electromagnetic Band Gap (EBG) structure 800 disposed on the third surface 620*a* when seen from above the first surface 610*a*.

The EBG structure 800 of the antenna device 501 according to various embodiments may include: a periodic pattern of conductive patches 710 facing the first surface 610*a* and spaced apart from the third surface 620*a*; and a plurality of conductive vias 810 electrically connected between each of the conductive patches 710 and the third surface 620*a*.

The conductive shield structure 522 of the antenna device 501 according to various embodiments may further include an insulating layer disposed on the third surface 620*a* between the conductive patches 710 and the third surface 620*a*, and the vias 810 may be formed through the insulating layer.

The antenna device 501 according to various embodiments may further include a display 101 exposed through at least a portion of the first plate 110A.

The conductive patches 710 and the conductive vias 810 of the antenna device 501 according to various embodiments each may be disposed on the third surface 620*a* by attaching a conductive film to the third surface 620*a*.

The conductive shield structure 522 of the antenna device 501 according to various embodiments may be manufactured in at least one of can, housing, enclosure, and lid shapes by bending a portion a plate-shaped frame using a metal plate or plastic added with conductive metal.

The conductive patches 710 of the antenna device 501 according to various embodiments may correspond to at least one of a rectangle, a circle, a crosshair type, a swastika type, and a hexagonal type.

The resonance frequency of the EBG structure 800 of the antenna device 501 according to various embodiments may be determined by the side lengths of the conductive patches 710, the gap between the conductive patches 710, the length of the conductive vias 810, and the radius of the conductive vias 810.

The conductive vias 810 of the antenna device 501 according to various embodiments may be cylinders or polyprisms.

In the first printed circuit board 520 of the antenna device 501 according to various embodiments, the conductive layers and one or more dielectric layers may be alternately stacked between the first surface 610*a* and the second surface 610*b*.

The electronic devices according to the various embodiments described herein may be various electronic devices. The electronic device, for example, may include a mobile communication device (e.g., a smartphone), a computer device, a mobile multimedia device, a mobile medical device, a camera, a wearable device, and an appliance. The electronic devices according to the embodiments are not limited to the devices described above.

Various embodiments and terms used in the embodiments are not intended to limit the technical features described herein to specific embodiments and should be understood as including various changes, equivalents, and replacements of corresponding embodiments. In the description of drawings, similar or relevant components may be given similar reference numerals. A singular form of a noun corresponding to an item may include the one item or a plurality of items unless stated clearly in the sentence. In the disclosure, expressions such as "A or B", "at least one of A and B", "at least one of A or B", "A, B, or C", "at least one of A, B, and C", and "at least one of A, B, or C" may include all possible combinations of the items in the expressions. Terms such as "first" and "second" may be used to simply discriminate the corresponding component from another corresponding component without limiting the corresponding components in another respect (e.g., importance or order). When a (e.g., first) component is stated as being "coupled" or "connected" to another (e.g., second) component with or without a term such as "functionally" or "in communication", it means that the component may be connected to another component directly (e.g., through a wire), wirelessly, or through a third component.

The term "module" used herein may include a unit implemented as hardware, software, or firmware, and for example, may be mutually used with a logic, a logical block, a part, or a circuit. The module may be an integrated part, or the minimum unit or a portion of the part that performs one or more functions. For example, according to an embodiment, the module may be an Application-Specific Integrated Circuit (ASIC).

Various embodiments described herein may be implemented as software (e.g., the program 440) including one or more instructions stored in a storage medium that can be read by a machine (e.g., the electronic device 401) (e.g., a built-in memory 436 or an external memory 438). For example, a processor (e.g., the processor 420) of a device (e.g., the electronic device 401) may call out at least one of stored instructions from a storage medium and may execute the instructions. This enables the device to operate to perform at least one function in accordance with the at least one or more called instructions. The one or more instructions may include codes constructed by a compiler or codes that can be executed by an interpreter. The machine-readable storage media may be provided in a non-transitory storage medium type. The expression 'non-transitory' only mean that the storage medium is a tangible device and does not include a signal (e.g., an electromagnetic wave) and this term does not discriminate the case in which data is semi-permanently stored and temporarily stored in the storage medium.

A method according to various embodiments disclosed herein may be included in a computer program product. The computer program product may be traded between a seller and a purchaser as a commodity. The computer program product may be distributed in the type of a machine-readable storage medium (e.g., a Compact Disc Read Only Memory (CD-ROM), or may be distributed (e.g., downloaded or uploaded) through an application store (e.g., play store) or between two user devices (e.g., smartphones) directly on the web. When the computer program product is distributed on the web, at least a portion of the computer program product may be at least temporarily stored or created in a machine-readable storage medium such as the memory of the server of the manufacturer, the server of an application store, or a relay server.

According to various embodiments, the components (e.g., a module or a program) may include a singular or a plurality of objects. According to various embodiments, one or more of the components described above or operations may be omitted, or one or more other components or operations may be added. Generally or additionally, a plurality of components (e.g., modules or programs) may be integrated into one component. In this case, integrated components can perform functions of one or more components of each of a plurality of components in the same way as or similarly to performing the functions through corresponding components of a plurality of components before integration. According to various embodiments, operations that are performed by a module, a program, or other components may be performed sequentially, in parallel, repeatedly, or heuristically, one or more of the operations may be performed in another order or omitted, or one or more other operations may be added.

The invention claimed is:

1. An antenna device comprising:
   a printed circuit board formed in a plate shape with both sides of a first surface and a second surface, and having one or more conductive layers between the first surface and the second surface;
   an array of conductive plates disposed on or in the printed circuit board in parallel with the first surface;
   a radio frequency integrated chip electrically connected with the array of conductive plates, coupled to the first surface, and being able to transmit or receive a frequency between 3 GHz and 300 GHz; and
   a conductive shield structure mounted on the first surface of the printed circuit board and electrically connected with the one or more conductive layers when covering the radio frequency integrated chip,
   wherein the conductive shield structure comprises:
   a third surface facing the first surface; and
   an electromagnetic band gap (EBG) structure disposed on the third surface when seen from above the first surface, and
   wherein the EBG structure comprises:
   a periodic pattern of conductive patches facing the first surface and spaced apart from the third surface; and
   a plurality of conductive vias respectively electrically connecting the conductive patches to the third surface.

2. The antenna device of claim 1, wherein the conductive shield structure further comprises an insulating layer disposed on the third surface between the conductive patches and the third surface, and
   wherein the insulating layer is formed on the third surface and the vias are formed through the insulating layer.

3. The antenna device of claim 2, wherein the conductive patches and the conductive vias are each disposed on the third surface by attaching a conductive film to the third surface.

4. The antenna device of claim 2, wherein the conductive patches and the conductive vias are disposed by 3D printing or casting.

5. The antenna device of claim 1, wherein the conductive shield structure is manufactured in at least one of can, housing, enclosure, and lid shapes by bending a portion of a plate-shaped frame using a metal plate or plastic added with conductive metal.

6. The antenna device of claim 1, wherein the conductive patches correspond to at least one of a rectangle, a circle, a crosshair type, a swastika type, and a hexagonal type.

7. The antenna device of claim 1, wherein a resonance frequency of the EBG structure is determined side lengths of the conductive patches, a gap between the conductive patches, lengths of the conductive vias, and radii of the conductive vias.

8. The antenna device of claim 1, wherein the conductive vias are cylinders or polyprisms.

9. The antenna device of claim 1, wherein the conductive layers and one or more dielectric layers are alternately stacked between the first surface and the second surface in first printed circuit board.

10. The antenna device of claim 3, wherein the conductive film is an anisotropic conductive film.

11. The antenna device of claim 1, wherein the array of conductive plates is a patch antenna.

12. The antenna device of claim 1, wherein the array of conductive plates is an antenna array.

13. The antenna device of claim 1, further comprising an additional printed circuit board having a processor or a memory mounted thereon,
    wherein the additional printed circuit board is electrically connected with the printed circuit board.

* * * * *